United States Patent
Inoue

(10) Patent No.: US 7,622,953 B2
(45) Date of Patent: Nov. 24, 2009

(54) TEST CIRCUIT, SELECTOR, AND SEMICONDUCTOR INTEGRATED CIRCUIT

(75) Inventor: Genichiro Inoue, Osaka (JP)

(73) Assignee: Panasonic Corporation, Osaka (JP)

( * ) Notice: Subject to any disclaimer, the term of this patent is extended or adjusted under 35 U.S.C. 154(b) by 245 days.

(21) Appl. No.: 11/743,854

(22) Filed: May 3, 2007

(65) Prior Publication Data

US 2008/0005632 A1  Jan. 3, 2008

(30) Foreign Application Priority Data

Jun. 14, 2006  (JP)  ............................. 2006-165248

(51) Int. Cl.
  *H03K 19/094* (2006.01)
(52) U.S. Cl. ........................... 326/56; 326/113; 326/16; 327/410
(58) Field of Classification Search ................... 326/56, 326/113, 16; 327/407–410
  See application file for complete search history.

(56) References Cited

U.S. PATENT DOCUMENTS 5,285,119 A  2/1994  Takahashi
5,955,912 A * 9/1999  Ko ............................... 327/410
6,016,564 A  1/2000  Hosokawa
6,232,799 B1 * 5/2001  Allen et al. .................. 326/113

FOREIGN PATENT DOCUMENTS

JP  11-052019  2/1999

OTHER PUBLICATIONS

English language Abstract of JP 11-052019.

* cited by examiner

*Primary Examiner*—Daniel D Chang
(74) *Attorney, Agent, or Firm*—Greenblum & Bernstein P.L.C.

(57) ABSTRACT

A test circuit according to the present invention performs a test of a first tri-state device and a second tri-state device having their outputs connected to the same node, and includes: a test output terminal; and a test unit operable to output a first logical value or a second logical value to the test output terminal according to whether the voltage of the node is higher or lower than a threshold value, and the test unit converts the intermediate potential occurring at the node into the first logical value and outputs the first logical value to the test output terminal when the first tri-state device outputs a high level signal to the node and the second tri-state device outputs a low level signal to the node.

9 Claims, 7 Drawing Sheets

TEST CIRCUIT, SELECTOR, AND SEMICONDUCTOR INTEGRATED CIRCUIT

BACKGROUND OF THE INVENTION (1) Field of the Invention

The present invention relates to a test circuit, a selector, and a semiconductor integrated circuit, and more particularly, to a test circuit that tests a plurality of tri-state devices having their outputs connected to the same node and a selector including the test circuit.

(2) Description of the Related Art

In recent years, semiconductor integrated circuits have been becoming denser and faster year by year, and with this, element circuits included in the semiconductor integrated circuits, which are constituent elements, are strongly required to realize high-speed operations while fulfilling easy fault detection.

An example of basic element circuits is a selector, and selectors that use tri-state devices have been known for years as selectors which operate at high speed. However, it is also known that fault detection is difficult in selectors that use tri-state devices.

Among tri-state devices, the following are considered faults that are difficult to detect by the selector that uses a tri-state device: when the control signal of at least one of the included tri-state devices malfunctions and this causes a fault in which the output of the tri-state device is always in high-impedance state (that is, when a non-selection state occurs); and a fault in which occurs when the output is always in non-high-impedance state (that is, when multiple selection occurs).

As a conventional solution to this problem, a method is known that is described in Japanese Laid-Open Patent Application No. 11-52019. According to this method, by providing the output part of the selector including tri-state devices with the function of pulling up or pulling down the output part at the time of the scan test only, the output is fixed to the logic "1" or "0" even when the control signal malfunctions to cause the non-selection state while minimizing the deterioration in the speed of the selector in the normal operation, so that fault detection can be correctly performed.

Hereinafter, a conventional selector using tri-state devices will be described by use of the drawings.

FIG. 1 shows the structure of the conventional selector shown in Japanese Laid-Open Patent Application No. 11-52019 mentioned above.

The selector 1000 shown in FIG. 1 includes tri-state devices 1001 and 1002 and a transistor 1003.

The tri-state device 1001 outputs the logical value of a data input terminal 1011 to a data output terminal 1040 when a data selection terminal 1021 is active. The output of the tri-state device 1001 is in high-impedance state when the data selection terminal 1021 is non-active. Likewise, the tri-state device 1002 outputs the logical value of a data input terminal 1012 when a data selection terminal 1022 is active. The output of the tri-state device 1002 is in high-impedance state when the data selection terminal 1022 is non-active.

The transistor 1003 is an NMOSFET, and has the function of pulling down the data output terminal 1040 when a scan mode signal terminal 1031 is active. The transistor 1003 is formed by a driving performance that is sufficiently low compared to that of the tri-state devices 1001 and 1002.

With this structure, when at least one of the data selection terminals 1021 and 1022 is faulty and the tri-state devices 1001 and 1002 are both high impedance, the scan mode signal terminal 1031 is active at the time of the scan test, the transistor 1003 pulls down the data output terminal, and the data output terminal 1040 outputs the logical value "0". Consequently, by the scan test, it can be judged that a fault occurs also when at least one of the data selection terminals 1021 and 1022 are faulty. In the normal operation, since the scan mode signal terminal 1031 is non-active, the adverse effect on the operating speed can be minimized.

SUMMARY OF THE INVENTION

However, in the selector described in Japanese Laid-Open Patent Application No. 11-52019, although a fault in which the outputs of all the tri-state device are high impedance and the data output terminal is high impedance can be detected, a fault in which a plurality of tri-state devices are active and cause data conflict cannot be detected.

Accordingly, an object of the present invention is to provide a test circuit, a selector, or a semiconductor integrated circuit capable of detecting a fault in which a plurality of tri-state devices are active, causing data conflict.

In order to achieve the aforementioned object, a test circuit according to the present invention performs a test of a first tri-state device and a second tri-state device having their outputs connected to the same node, and includes a test output terminal; and a test unit that outputs a first logical value or a second logical value to the test output terminal according to whether a voltage of the node is higher or lower than a threshold value. The test unit converts an intermediate potential occurring at the node into the first logical value and outputs the first logical value to the test output terminal when the first tri-state device outputs a high level signal to the node and the second tri-state device outputs a low level signal to the node.

According to this structure, the first logical value is outputted when the conflict of the outputs of a plurality of tri-state devices occurs and an intermediate potential is outputted due to a fault. Thereby, a fault in which a plurality of tri-state devices are active, causing data conflict can be detected from the output of the test circuit for an input pattern that a logical value different from the first logical value is the expected value.

Moreover, a selector according to the present invention has a test mode to detect a fault, and includes: a data output terminal; a test output terminal; a first tri-state device having output connected to the data output terminal; a second tri-state device having output connected to the data output terminal; and a test unit that outputs a first logical value or a second logical value to the test output terminal according to whether a voltage of the data output terminal is higher or lower than a threshold value in the test mode. The test unit converts an intermediate potential occurring at the data output terminal into the first logical value and outputs the first logical value to the test output terminal when the first tri-state device outputs a high level signal to the data output terminal and the second tri-state device outputs an low level signal to the data output terminal in the test mode.

According to this structure, the selector outputs the first logical value to the test output terminal when the first tri-state device outputs the high level, the second tri-state device outputs the low level, and the potential of the data output terminal is an intermediate potential due to the fault. Thereby, a fault in which a plurality of tri-state devices are active, causing data conflict can be detected from the logical value outputted to the data output terminal for an input pattern that a logical value different from the first logical value is the expected value.

Moreover, the test unit may include a semiconductor switch that has one end connected to the data output terminal, is on in the test mode, and is off when not in the test mode; and an inverter having a input connected to the other end of the semiconductor switch and a output connected to the test output terminal.

According to this structure, since the semiconductor switch (for example, an NMOSFET) is off in the normal operation (other than in the test mode), the increase in the load capacity for the data output terminal can be reduced. That is, the reduction in the operating speed of the selector can be suppressed.

Moreover, the first logical value may be a logical value "1", the inverter may include: a first p-type transistor having a gate connected to the other end of the semiconductor switch, a drain connected to the test output terminal, and a source connected to a power source; and a first n-type transistor having a gate connected to the other end of the semiconductor switch, a drain connected to the test output terminal, and a source connected to a ground, and a driving performance of the first p-type transistor may be higher than a driving performance of the first n-type transistor.

According to this structure, the switching potential of the inverter is higher than VDD/2 (here, VDD is the power supply voltage). Thereby, the logical value "1" can be outputted when the first tri-state device outputs the high level, the second tri-state device outputs the low level, and the potential of the data output terminal is an intermediate potential due to a fault.

Moreover, the first tri-state device and the second tri-state device may include: a second p-type transistor that supplies a high level voltage to the data output terminal; and a second n-type transistor that supplies a low level voltage to the data output terminal, and a driving performance of the second n-type transistor may be higher than a driving performance of the second p-type transistor.

According to this structure, the potential of the data output terminal when the first tri-state device outputs the high level and the second tri-state device outputs the low level is lower than VDD/2. Therefore, the logical value "0" can be outputted with stability when a fault occurs (when the first tri-state device outputs the high level and the second tri-state device outputs the low level) without the need for the switching potential of the inverter to be unnecessarily lower than VDD/2. In addition, the flexibility of design can be increased.

Moreover, the first logical value may be a logical value "0", the inverter may include: a first p-type transistor having a gate connected to the other end of the semiconductor switch, a drain connected to the test output terminal, and a source connected to a power source; and a first n-type transistor having a gate connected to the other end of the semiconductor switch, a drain connected to the test output terminal, and a source connected to a ground, and a driving performance of the first n-type transistor may be higher than a driving performance of the first p-type transistor.

According to this structure, the switching potential of the inverter is lower than VDD/2 (here, VDD is the power supply voltage). Thereby, the logical value "0" can be outputted when the first tri-state device outputs the high level, the second tri-state device outputs the low level, and the potential of the data output terminal is an intermediate potential due to a fault.

Moreover, the first tri-state device and the second tri-state device may include: a second p-type transistor that supplies an high level voltage to the data output terminal; and a second n-type transistor that supplies a low level voltage to the data output terminal, and a driving performance of the second p-type transistor may be higher than a driving performance of the second n-type transistor.

According to this structure, the potential of the data output terminal when the first tri-state device outputs the high level and the second tri-state device outputs the low level is higher than VDD/2. Therefore, the logical value "1" can be outputted with stability when a fault occurs (when the first tri-state device outputs the high level and the second tri-state device outputs the low level) without the need for the switching potential of the inverter to be unnecessarily higher than VDD/2. In addition, the flexibility of design can be increased.

Moreover, the first logical value may be a logical value "1", the inverter may include: a first p-type transistor having a gate connected to the other end of the semiconductor switch, a drain connected to the test output terminal, and a source connected to a power source; and a first n-type transistor having a gate connected to the other end of the semiconductor switch, a drain connected to the test output terminal, and a source connected to a ground, and a gate width of the first p-type transistor may be equal to or greater than 4.4 times a gate width of the first n-type transistor.

According to this structure, the driving performance of the first p-type transistor is equal to or higher than twice that of the first n-type transistor. Thereby, the logical value "1" can be outputted when the first tri-state device outputs the high level, the second tri-state device outputs the low level, and the potential of the data output terminal is an intermediate potential due to a fault.

Moreover, the first tri-state device and the second tri-state device may include: a second p-type transistor that supplies a high level voltage to the data output terminal; and a second n-type transistor that supplies an low level voltage to the data output terminal, and a gate width of the second p-type transistor may be equal to or less than 1.1 times a gate width of the second n-type transistor.

According to this structure, the driving performance of the second n-type transistor is equal to or higher than twice that of the second p-type transistor. Thereby, the potential of the data output terminal when the first tri-state device outputs the high level and the second tri-state device outputs the low level is lower than VDD/2. Therefore, the logical value "0" can be outputted with stability when a fault occurs (when the first tri-state device outputs the high level and the second tri-state device outputs the low level) without the need for the switching potential of the inverter to be unnecessarily higher than VDD/2. In addition, the flexibility of design can be increased.

Moreover, the first logical value may be a logical value "0", the inverter may include: a first p-type transistor having a gate connected to the other end of the semiconductor switch, a drain connected to the test output terminal, and a source connected to a power source; and a first n-type transistor having a gate connected to the other end of the semiconductor switch, a drain connected to the test output terminal, and a source connected to a ground, and a gate width of the first p-type transistor may be equal to or less than 1.1 times a gate width of the first n-type transistor.

According to this structure, the driving performance of the first n-type transistor is equal to or higher than twice that of the first p-type transistor. Thereby, the logical value "0" can be outputted when the first tri-state device outputs the high level, the second tri-state device outputs the low level, and the potential of the data output terminal is an intermediate potential due to a fault.

Moreover, the first tri-state device and the second tri-state device may include: a second p-type transistor that supplies a high level voltage to the data output terminal; and a second n-type transistor that supplies an low level voltage to the data output terminal, and a gate width of the second p-type transistor may be equal to or greater than 4.4 times a gate width of the second n-type transistor.

According to this structure, the driving performance of the second p-type transistor is equal to or higher than twice that of the second n-type transistor. Thereby, the potential of the data output terminal when the first tri-state device outputs the high level and the second tri-state device outputs the low level is higher than VDD/2. Therefore, the logical value "0" can be outputted with stability when a fault occurs (when the first tri-state device outputs the high level and the second tri-state device outputs the low level) without the need for the switching potential of the inverter to be unnecessarily lower than VDD/2. In addition, the flexibility of design can be increased.

Moreover, the test unit may output the first logical value to the test output terminal when outputs of the first tri-state device and the second tri-state device are high impedance in the test mode.

According to this structure, the first logical value is outputted to the test output terminal when the outputs of the first tri-state device and the second tri-state device are in high-impedance state due to a fault in the test mode. Thereby, a fault in which all the tri-state devices are non-selected and the data output terminal is in high-impedance state can be detected from the logical value outputted to the test output terminal for an input pattern that a logical value different from the first logical value is the expected value.

Moreover, the test unit may further include a third n-type transistor in which a signal whose value is the logical value "1" in the test mode is inputted to a gate, the third n-type transistor having a drain connected to the other end of the semiconductor switch and a source connected to a ground.

According to this structure, the data output terminal and the input of the inverter are pulled down by the third n-type transistor when the outputs of the first tri-state device and the second tri-state device are in high-impedance state due to a fault in the test mode. Consequently, the logical value "1" is outputted from the test output terminal. Thereby, a fault in which all the tri-state devices are non-selected and the data output terminal is in high-impedance state can be detected from the logical value outputted to the test output terminal for an input pattern that the logical value "0" is the expected value.

Moreover, the test unit may further include a third p-type transistor in which a signal whose value is the logical value "0" in the test mode is inputted to a gate, the third p-type transistor having a drain connected to the other end of the semiconductor switch and a source connected to the power source.

According to this structure, the data output terminal and the input of the inverter are pulled up by the third p-type transistor when the outputs of the first tri-state device and the second tri-state device are in high-impedance state due to a fault in the test mode. Consequently, the logical value "0" is outputted from the test output terminal. Thereby, a fault in which all the tri-state devices are non-selected and the data output terminal is in high-impedance state can be detected from the logical value outputted to the test output terminal for an input pattern that the logical value "1" is the expected value.

Moreover, a semiconductor integrated circuit according to the present invention includes: a plurality of selectors described above; and a logical circuit that outputs a second logical value when at least one of the selectors outputs the first logical value to the test output terminal, and outputs a fourth logical value different from the second logical value when all the selectors output a third logical value different from the first logical value to the test output terminal.

According to this structure, the logical circuit outputs the third logical value when at least one of the selectors outputs the first logical value. Thereby, a test as to whether a faulty selector is included in the selectors or not can be performed by inputting an input pattern that the outputs of all the selectors are logical values different from the first logical value and monitoring the output of the logical value. Since this makes it unnecessary to individually monitor the test output terminals of the selectors, the test can be performed easily.

Moreover, the semiconductor integrated circuit may further include a flip-flop to be scanned having a data input terminal connected to an output of the logical circuit.

According to this structure, faults of all the selectors can be detected by providing one flip-flop to be scanned for a plurality of selectors. Consequently, the number of flip-flops to be scanned can be significantly reduced compared to when a flip-flop to be scanned is provided for each of the selectors. Thereby, the reduction in the number of scan shifts, the reduction in area, and the reduction in clock load can be realized.

The present invention is capable of providing a test circuit, a selector, and a semiconductor integrated circuit capable of detecting a fault in which a plurality of tri-state devices are active, causing data conflict.

FURTHER INFORMATION ABOUT TECHNICAL BACKGROUND TO THIS APPLICATION

The disclosure of Japanese Patent Application No. 2006-165248 filed on Jun. 14, 2006 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention.

In the drawings.

DESCRIPTION OF THE PREFERRED EMBODIMENT(S)

Hereinafter, embodiments of the present invention will be described with reference to the drawings.

First Embodiment

A selector according to a first embodiment of the present invention is capable of detecting a fault in which a plurality of tri-state devices are simultaneously active by including a circuit that outputs the logical value "1" when the data output terminals are at an intermediate potential.

First, the structure of the selector according to the first embodiment of the present invention will be described.

Figure 1:
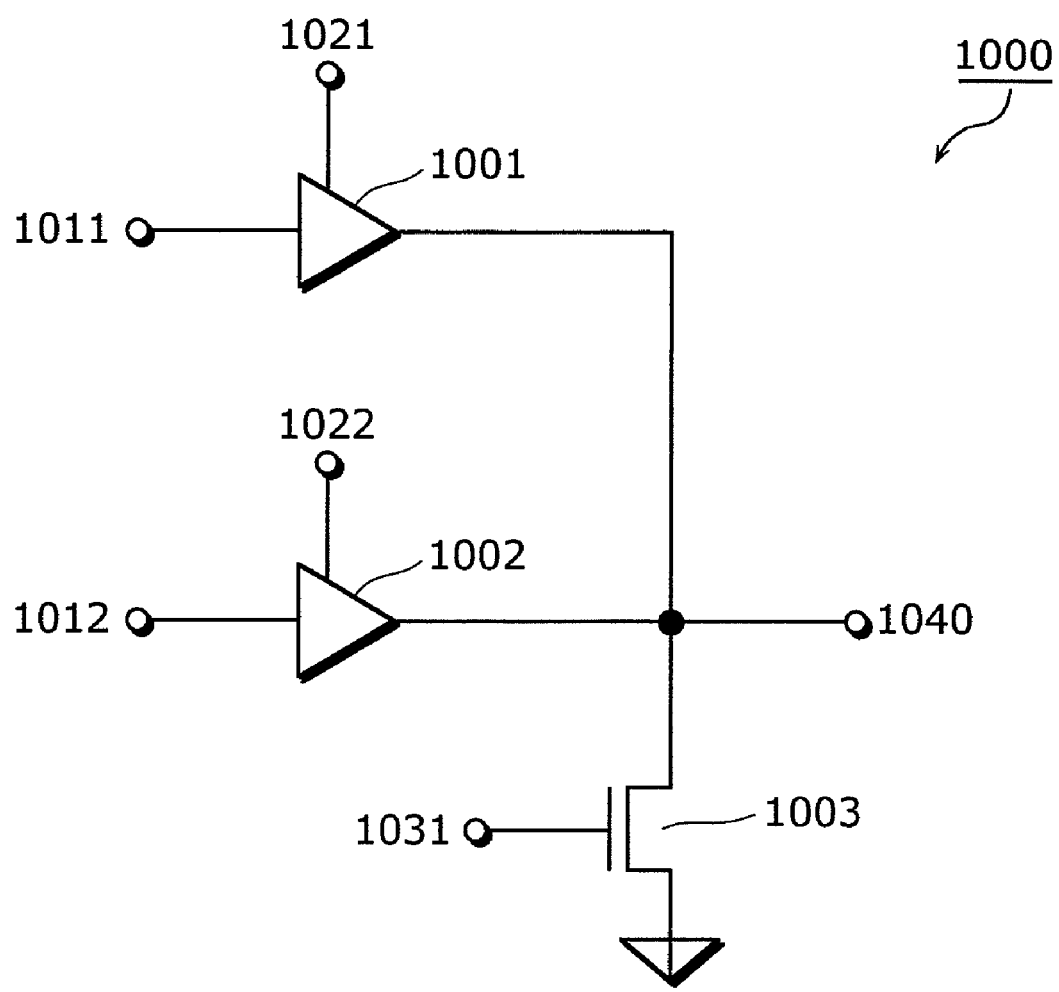
FIG. 1 is a diagram showing the structure of the conventional selector.
Figure 2:
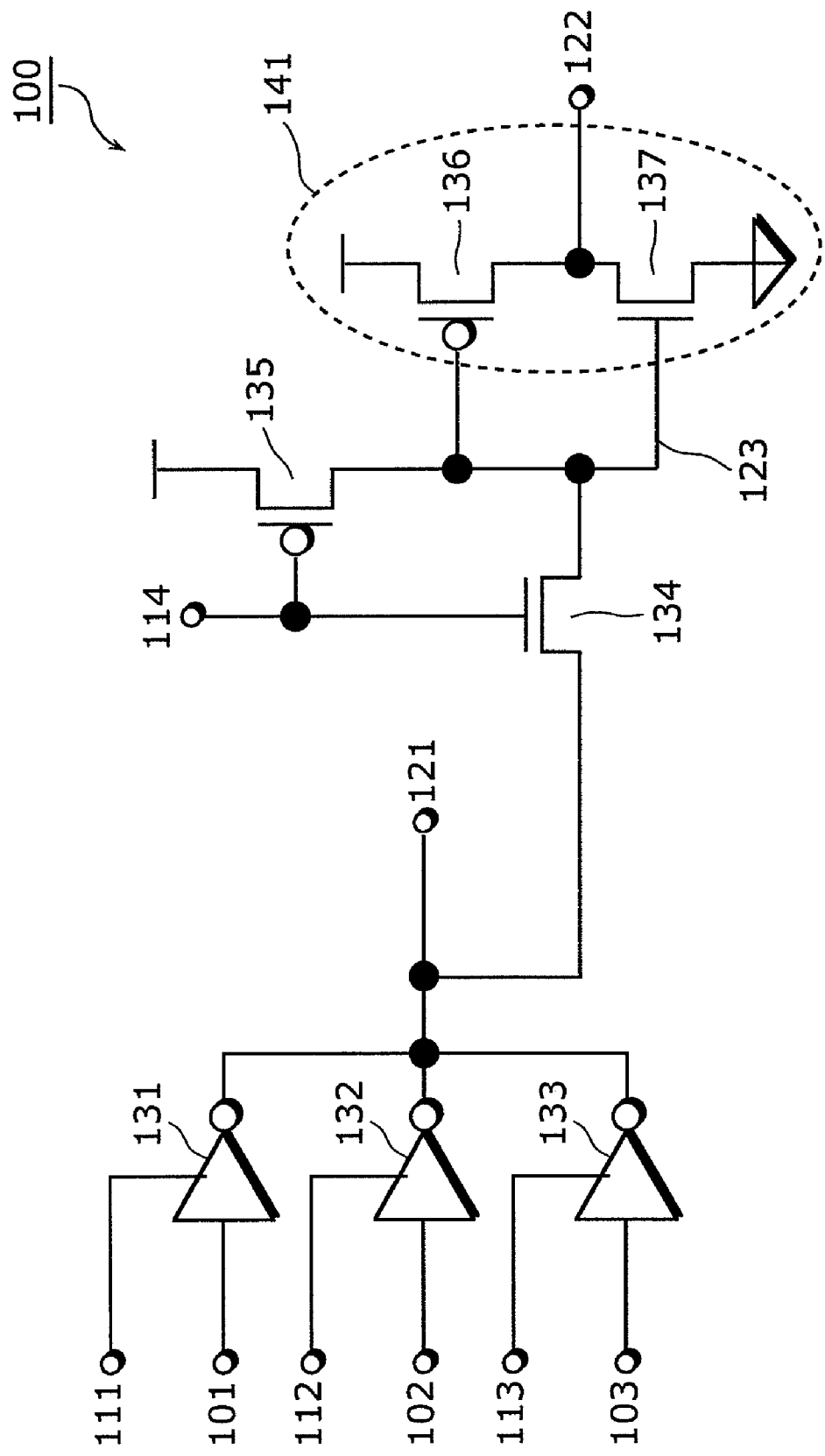
FIG. 2 is a diagram showing the structure of a selector according to a first embodiment.

FIG. 2 shows the structure of the selector according to the first embodiment of the present invention. The selector 100 shown in FIG. 2 is a three-input selector having a test mode to detect a fault of the selector 100. The selector 100 includes: data input terminals 101 to 103; data selection terminals 111 to 113; a mode selection terminal 114; a data output terminals 121 and a test output terminal 122; tri-state inverters 131, 132, and 133; a transistor 134; a transistor 135; and an inverter 141.

The outputs of the tri-state inverters 131 to 133 are connected to the data output terminal 121. The tri-state inverter 131 inverts the logical value of the data input terminal 101 and outputs the inverted value to the data output terminal 121 when the data selection terminal 111 is "1". The output of the tri-state inverter 131 is in a high-impedance state when the data selection terminal 111 is "0". Likewise, the tri-state inverter 132 inverts the logical value of the data input terminal 102 and outputs the inverted value to the data output terminal 121 when the data selection terminal 112 is "1". The output of the tri-state inverter 132 is in high-impedance state when the data selection terminal 112 is "0". The tri-state inverter 133 inverts the logical value of the data input terminal 103 and outputs the inverted value to the data output terminal 121 when the data selection terminal 113 is "1". The output of the tri-state inverter 133 is in high-impedance state when the data selection terminal 113 is "0". The data output terminal 121 is connected to the circuit of the subsequent stage used in the normal operation.

The transistor 134 is an NMOSFET, and has its gate connected to the mode selection terminal 114, one of its drain and source connected to the data output terminal 121, and the other of its drain and source connected to a node 123 which is the input of the inverter 141. The transistor 134 is switched between on and off according to whether the test mode is on or not. The mode selection terminal 114 is "1" in the test mode, and "0" in the normal operation (other than in the test mode). That is, through the transistor 134, there is continuity between the data output terminal 121 and the node 123 in the test mode, and the continuity is cut off in the normal operation. The transistor 134 has a small gate width, and the capacity of its drain connected to the data output terminal 121 is small.

The transistor 135 is a PMOSFET, and has its gate connected to the mode selection terminal 114, its drain connected to the node 123, and its source connected to the power source. The transistor 135 pulls up the node 123 which is floating in the normal operation.

The inverter 141 has its input connected to the node 123 and its output to the test output terminal 122. The inverter 141 inverts the logic of the node 123, and outputs the inverted logic to the test output terminal 122. That is, the inverter 141 outputs the logical value "1" or "0" to the test output terminal 122 according to whether the voltage of the data output terminal 121 is higher or lower than a threshold value (the switching potential of the inverter 141) in the test mode. The inverter 141 includes a transistor 136 and a transistor 137. The test output terminal 122 is connected to the circuit of the succeeding stage used in the test mode. For example, the test output terminal 122 is connected to a flip-flop to be scanned, directly or through at least one logical circuit.

The transistor 136 is a PMOSFET, and has its gate connected to the node 123, its drain connected to the test output terminal 122, and its source connected to the power source. The transistor 137 is an NMOSFET, and has its gate connected to the node 123, its drain connected to the test output terminal 122, and its source connected to a ground (GND). The driving performance of the transistor 136 is set higher than that of the transistor 137. For example, the driving performance of the transistor 136 is equal to or higher than twice that of the transistor 137. That is, the switching potential of the inverter 141 is higher than ½×VDD (here, VDD is the power supply voltage). Further, the switching potential of the inverter 141 is higher than the highest intermediate potential that can be achieved when two of the data selection terminals 111 to 113 are "1" to cause data multiple selection, the conflict in the output data of the tri-state inverters 131 to 133 occurs and the data output terminal 121 is at an intermediate potential.

The tri-state inverters 131 to 133 are set so that their driving performance to drive "0" is higher than that to drive "1". That is, two of the data selection terminals 111 to 113 are "1", causing data multiple selection, and the intermediate potential of the data output terminal 121 is lower than ½×VDD. For example, the tri-state inverters 131 to 133 are provided with a PMOSFET supplying a high level voltage (logical value "1") to the data output terminal 121 and an NMOSFET supplying a low level voltage (logical value "0") to the data output terminal 121, and the driving performance of the NMOSFET is higher than that of the PMOSFET. For example, the driving performance of the NMOSFET is equal to or higher than twice that of the PMOSFET.

As the method for determining the driving abilities of the transistors 136 and 137 included in the inverter 141, a method can be used in which the gate lengths L of the transistors 136 and 137 are made the same and the gate widths W thereof are made different from each other. Generally, when the ratios W/L between the gate length L and the gate width W are the same, the ratio between the driving abilities of the NMOSFET and the PMOSFET is approximately 2.2:1. Therefore, in order that the driving performance of the transistor 136 which is a PMOSFET is equal to or higher than twice that of the transistor 137 which is an NMOSFET, the gate width of the transistor 136 is made equal to or greater than 4.4 times that of the transistor 137. In order that the driving performance of the NMOSFETs included in the tri-state inverters 131 to 133 is equal to or higher than twice that of the PMOSFETs, the gate width of the PMOSFETs is made equal to or less than 1.1 times that of the NMOSFETs.

With the above-described structure, in the selector 100, when a fault causes one of the tri-state inverters 131 to 133 to output a high level signal to the data output terminal 121 and causes one of the tri-state inverters 131 to 133 to output a low level signal to the data output terminal 121 in the test mode, the intermediate potential occurring at the data output terminal 121 is converted into the logical value "1", and the logical value "1" is outputted to the test output terminal 122.

Next, the operation of the selector 100 shown in FIG. 2 will be described.

In the normal operation, "0" is inputted to the mode selection terminal 114, the transistor 134 is turned off, and the transistor 135 is turned on, whereby the node 123 becomes "1" and "0" is outputted from the test output terminal 122.

In the test operation, the mode selection terminal 114 becomes active by "1" being inputted thereto, the transistor 134 is turned on, and the transistor 135 is turned off, whereby the data output terminal 121 and the node 123 are connected through the transistor 134 and a logical value corresponding to the potential of the data output terminal 121 is outputted from the test output terminal 122 (the state of the correspondence will be mentioned later).

In the selector 100 including these constituent elements, normally, "1" (active) is inputted to only one of the data selection terminals 111 to 113, and "0" (non-active) is inputted to the other terminals. When only one terminal is active (one-hot), the logic inverted signal of the data input terminal corresponding to the one-hot data selection terminal is outputted from the data output terminal 121. For example, when the data selection terminal 111 is in one-hot state and active, the inverted signal of the corresponding data input terminal 101 is selected and outputted from the data output terminal 121.

Such a selector 100 is capable of operating at high speed when the values of the data selection terminals 111 to 113 are previously fixed, because signals are propagated from the data input terminals 101 to 103 to the data output terminal 121 through only one stage of tri-state inverter.

Below, the operation will be described that is performed when the data multiple selection state occurs because a fault corresponding to a stuck-at-1 fault occurs in any of the data selection terminals 111 to 113 due to a stuck-at-1 fault of the data selection terminals 111 to 113 themselves or a fault of an external control circuit supplying signals to the data selection terminals 111 to 113. While a case where the data selection terminal 111 is always active because of a stuck-at-1 fault occurring in itself will be described in this embodiment, the operation is similar in the cases of the data selection terminals 112 and 113.

When the data input terminal 101 is selected (case 1), "1" is inputted to the data selection terminal 111. Therefore, even when a stuck-at-1 fault occurs in the data selection terminal 111, the data input terminal 101 is selected similarly to when there is no fault. Specifically, irrespective of the values of the data input terminals 102 and 103, when the data input terminal 101 is "1", "0" is outputted to the data output terminal 121, and when the data input terminal 101 is "0", "1" is outputted thereto.

In the test mode in which the mode input signal 114 is "1", similarly, an operation is performed as if there were no fault. That is, when the data input terminal 101 is "1", "1" is outputted to the test output terminal 122, and when the data input terminal 101 is "0" "0" is outputted to the test output terminal 122. Therefore, the stuck-at-1 fault of the data selection terminal 111 cannot be detected from the logical value of the test output terminal 122 when the data input terminal 101 is selected.

When the data input terminal 102 is selected (case 2), the data selection terminal 112 is "1", and the data selection terminal 111 is "1" because of the fault, so that data multiple selection of the tri-state inverters 131 and 132 occurs. This will be described with respect to subdivided cases.

When the data input terminal 102 is selected, "1" is inputted to the data input terminal 101 and "1" is inputted to the data input terminal 102 (case 2.1), since the tri-state inverters 131 and 132 both output "0", "0" is outputted from the data output terminal 121. Therefore, the operation is performed as if there were no fault.

In the test mode in which the mode input signal 114 is "1", similarly, the operation is performed as if there were no fault. That is, similarly to when there is no fault, "1" is outputted from the test output terminal 122. Therefore, the stuck-at-1 fault of the data selection terminal 111 cannot be detected from the logical value of the test output terminal 122 when the data input terminal 102 is selected, "1" is inputted to the data input terminal 101 and "1" is inputted to the data input terminal 102.

When the data input terminal 102 is selected, "0" is inputted to the data input terminal 101 and "0" is inputted to the data input terminal 102 (case 2.2), since the tri-state inverters 131 and 132 both output "1" "1" is outputted from the data output terminal 121. Therefore, the operation is performed as if there were no fault.

In the test mode in which the mode input signal 114 is "1", similarly, the operation is performed as if there were no fault. That is, similarly to when there is no fault, " " is outputted from the test output terminal 122. Therefore, the stuck-at-1 fault of the data selection terminal 111 cannot be detected from the logical value of the test output terminal 122 when the data input terminal 102 is selected, "0" is inputted to the data input terminal 101 and "0" is inputted to the data input terminal 102.

When the data input terminal 102 is selected, "1" is inputted to the data input terminal 101 and "0" is inputted to the data input terminal 102 (case 2.3), an intermediate potential is outputted from the data output terminal 121 since the tri-state inverter 131 outputs "0" and the tri-state inverter 132 outputs "1". The signal at the intermediate potential depends on the switching potential of the circuit of the succeeding stage, and is propagated as the logical value "0" or "1". That is, the logical value cannot be fixed by the selector itself.

In the test mode in which the mode input signal 114 is "1", the intermediate potential of the data output terminal 121 is propagated to the input of the inverter 141 through the transistor 134. The inverter 141 outputs "1" to the test output terminal 122 because the switching potential is set to a potential higher than the highest intermediate potential that can be achieved in a case where, when two of the tri-state inverters 131 to 133 are multi-selected, one outputs "1" and the other outputs "0", causing signal conflict; this makes the potential an intermediate potential. When there is no fault, since the data input terminal 102 is "0", "1" is outputted to the data output terminal 121 and "0" which is the inverted signal of the signal of the data output terminal 121 is outputted to the test output terminal 122. Therefore, the logical value outputted to the test output terminal 122 is different from that when there is no fault. Consequently, the stuck-at-1 fault of the data selection terminal 111 can be detected from the logical value of the test output terminal 122 when the data input terminal 102 is selected, "1" is inputted to the data input terminal 101 and "0" is inputted to the data input terminal 102.

When the data input terminal 102 is selected, "0" is inputted to the data input terminal 101 and "1" is inputted to the data input terminal 102 (case 2.4), since the tri-state inverter 131 outputs "1" and the tri-state inverter 132 outputs "0", an intermediate potential is outputted from the data output terminal 121. The signal at the intermediate potential depends on the switching potential of the circuit of the succeeding stage, and is propagated as the logical value "0" or "1". That is, the logical value cannot be fixed by the selector itself.

In the test mode in which the mode input signal 114 is "1", the intermediate potential of the data output terminal 121 is propagated to the input of the inverter 141 through the transistor 134. The inverter 141 outputs "1" to the test output terminal 122 because the switching potential is set to a potential higher than the highest intermediate potential that can be achieved in a case where, when two of the tri-state inverters 131 to 133 are multi-selected, one outputs "1" and the other outputs "0", causing signal conflict and this makes the potential an intermediate potential. When there is no fault, since the data input terminal 102 is "1", "0" is outputted to the data output terminal 121 and "1" which is the inverted signal of the signal of the data output terminal 121 is outputted to the test output terminal 122. Therefore, the logical value outputted to the test output terminal 122 is the same as that when there is no fault. Consequently, the stuck-at-1 fault of the data selection terminal 111 cannot be detected from the logical value of the test output terminal 122 when the data input terminal 102 is selected, "1" is inputted to the data input terminal 101 and "0" is inputted to the data input terminal 102.

As described above, the stuck-at-1 fault of the data selection terminal 111 can be detected from the logical value of the test output terminal 122 in the case 2.3 (when the data input terminal 102 is selected, "1" is inputted to the data input terminal 101 and "0" is inputted to the data input terminal 102). For example, it can be determined that the data selection terminal 111 causes a stuck-at-1 fault from the circumstance that the patterns of the cases 1, 2.1, 2.2, 2.3, and 2.4 are provided as the input signals and the output of the test output terminal 122 does not coincide with the expected value only in the case 2.3.

Although not described, a similar operation to the above-described operation performed when the data input terminal 102 is selected is performed when the data input terminal 103 is selected.

Likewise, stuck-at-1 faults of the data selection terminals 112 and 113 can also be determined.

From the above, in the selector 100 according to the present embodiment, when an intermediate potential is outputted due to a fault, in the test mode, the intermediate potential can be fixed to a predetermined logical value and outputted to the test output terminal 122. Therefore, a fault in which a plurality of tri-state devices are selected can be detected by determining whether the logical value of the test output terminal 122 coincides with the expected value or not by scanning. That is, the fault detectivity of the semiconductor integrated circuit can be improved by using the selector 100 according to the present invention.

Moreover, in the selector 100 according to the present embodiment, the transistor 134 is off in the normal operation. Moreover, the transistor 134 is set, for example, so that the load capacity for the data output terminal 121 is minimized by reducing the gate width. Thereby, the increase in the load capacity for the data output terminal 121 can be reduced in the normal operation. Consequently, the reduction in the operating speed of the selector 100 can be suppressed.

Moreover, in the selector 100 according to the present embodiment, the intermediate potential outputted when the outputs of the tri-state inverters 131 to 133 conflict due to a fault is lower than VDD/2. Consequently, since it is unnecessary that the switching potential of the inverter 141 be extremely higher than VDD/2, design can be performed easily. In addition, the flexibility of design can be increased.

Moreover, in the selector 100 according to the present embodiment, a switch that switches between on and off of the data output terminal 121 and the input of the inverter 141 is formed of an NMOSFET. Thereby, even when a low potential (for example, a potential close to the threshold value of the transistor or equal to or lower than the threshold value) is outputted to the data output terminal 121, the low-potential signal can be propagated to the input of the inverter 141.

While the number of tri-state inverters 131 to 133 is three in the description given above, the number of tri-state inverters may be two or more.

Moreover, while tri-state inverters are used as the tri-state devices in the description given above, the present invention is not limited thereto. For example, tri-state buffers may be used as the tri-state devices.

Moreover, while the tri-state devices are active when the control signal is "1" in the description given above, tri-state devices that are active when the control signal is "0" may be used.

Moreover, while the transistor 134 used as the switch is an NMOSFET, it may be a semiconductor switch such as a PMOSFET or an analog switch. In this case, the logic of the mode selection terminal 114 is set so that the switch is on in the test mode and is off in the normal operation.

Moreover, while the selector 100 is formed of a MOSFET in the description given above, it may be formed of a different transistor such as a bipolar transistor.

Moreover, while the inverted logic of the data input terminal is outputted from the data output terminal 121 in the description given above, the same logic may be outputted. Moreover, while the same logic as that of the data input terminal is outputted from the test output terminal 122 in the description given above, the inverted logic may be outputted.

Moreover, while the driving performance of the tri-state inverters 131 to 133 is set so that a value lower than VDD/2 is outputted when an intermediate potential is outputted to the data output terminal 121 due to a fault in the description given above, the driving performance of the tri-state inverters 131 to 133 may be any value as long as the inverter 141 outputs the intermediate potential outputted to the data output terminal 121 due to a fault, to the test output terminal 122 as the logical value "1". Thereby, the operating speed and the like of the selector 100 can be optimized.

Moreover, while the selector 100 having a plurality of tri-state inverters 131 to 133 is described as an example in the description given above, the present invention is applicable to a test of a plurality of tri-state devices having their outputs connected to the same node. For example, the present invention is also applicable to a circuit that tests the signal on the bus to which the outputs of a plurality of tri-state devices are connected and the tri-state devices connected to the bus.

Second Embodiment

While the selector 100 that outputs the logical value "1" when an intermediate potential is outputted to the data output terminal 121 due to a fault is described in the above-described first embodiment of the present invention, in a second embodiment of the present invention, a selector will be described that outputs the logical value "0" when an intermediate potential is outputted to the data output terminal due to a fault.

First, the structure of the selector according to the second embodiment of the present invention will be described.

Figure 3:
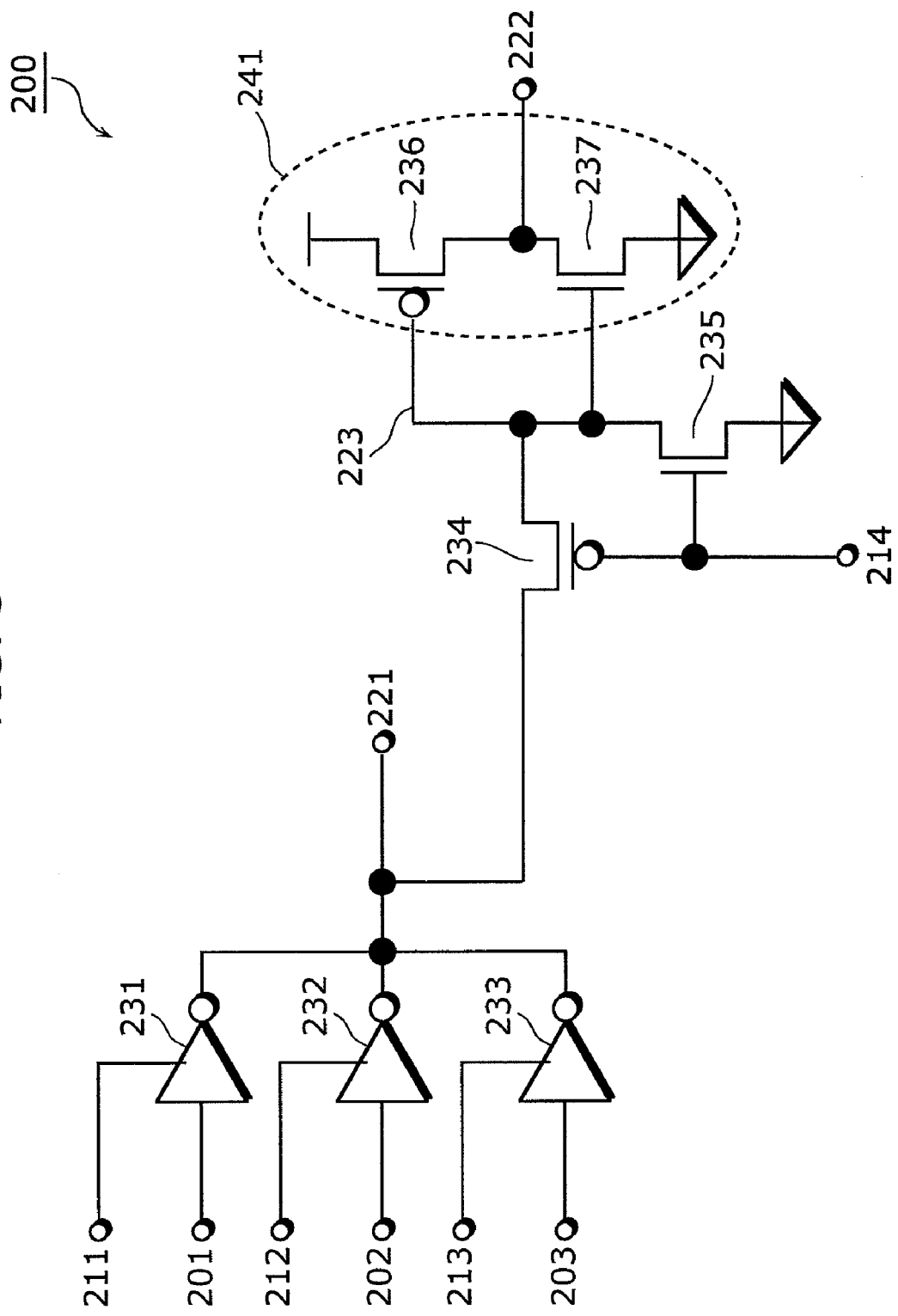
FIG. 3 is a diagram showing the structure of a selector according to a second embodiment.

FIG. 3 shows the structure of the selector according to the second embodiment of the present invention. The selector 200 is a three-input selector having a test mode to detect a fault of the selector. The selector 200 includes: data input terminals 201 to 203; data selection terminals 211 to 213; a mode selection terminal 214; a data output terminal 221 and a test output terminal 222; tri-state inverters 231, 232, and 233; a transistor 234; a transistor 235; and an inverter 241.

Like the first embodiment, the outputs of the tri-state inverters 231 to 233 are connected to the data output terminal 221. The tri-state inverter 231 inverts the logical value of the data input terminal 201 and outputs the inverted value to the data output terminal 221 when the data selection terminal 211 is "1". The output of the tri-state inverter 231 is in high-impedance state when the data selection terminal 211 is "0". Likewise, the tri-state inverter 232 inverts the logical value of the data input terminal 202 and outputs the inverted value to the data output terminal 221 when the data selection terminal 212 is "1". The output of the tri-state inverter 232 is in high-impedance state when the data selection terminal 212 is "0". The tri-state inverter 233 inverts the logical value of the data input terminal 203 and outputs the inverted value to the data output terminal 221 when the data selection terminal 213 is "1". The output of the tri-state inverter 233 is in high-impedance state when the data selection terminal 213 is "0".

The transistor 234 is a PMOSFET, and has its gate connected to the mode selection terminal 214, one of its drain and source connected to the data output terminal 221, and the other of its drain and source connected to a node 223 which is the input of the inverter 241. The transistor 234 is switched between on and off according to whether the test mode is on or not. The mode selection terminal 214 is "0" in the test mode, and "1" in the normal operation (other than in the test mode). That is, through the transistor 234, there is continuity between the data output terminal 221 and the node 223 in the test mode, and the continuity is cut off in the normal operation. The transistor 234 has a small gate width, and the capacity of its drain connected to the data output terminal 221 is small.

The transistor 235 is an NMOSFET, and has its gate connected to the mode selection terminal 214, its drain connected to the node 223, and its source connected to GND. The transistor 235 pulls down the node 223 which is floating in the normal operation.

The inverter 241 has its input connected to the node 223 and its output to the test output terminal 222. The inverter 241 inverts the logic of the node 223, and outputs the inverted logic to the test output terminal 222. That is, in the test mode, the inverter 241 outputs the logical value "1" or "0" to the test output terminal 222 according to whether the voltage of the data output terminal 221 is higher or lower than a threshold value (the switching potential of the inverter 241). The inverter 241 includes a transistor 236 and a transistor 237.

The transistor 236 is a PMOSFET, and has its gate connected to the node 223, its drain connected to the test output terminal 222, and its source connected to the power source. The transistor 237 is an NMOSFET, and has its gate connected to the node 223, its drain connected to the test output terminal 222, and its source connected to GND. The driving performance of the transistor 237 is higher than that of the transistor 236. For example, the driving performance of the transistor 237 is equal to or higher than twice that of the transistor 236. That is, the switching potential of the inverter 241 is lower than $\frac{1}{2} \times VDD$ (here, VDD is the power supply voltage). Further, the switching potential of the inverter 241 is lower than the lowest intermediate potential that can be achieved when two of the data selection terminals 211 to 213 are "1" to cause data multiple selection, the conflict of the output data of the tri-state inverters 231 to 233 occurs, and the data output terminal 221 is at an intermediate potential.

The tri-state inverters 231 to 233 are set so that their driving performance to drive "1" is higher than that to drive "0". That is, two of the data selection terminals 211 to 213 are "1" to cause data multiple selection, and the intermediate potential of the data output terminal 221 is higher than $\frac{1}{2} \times VDD$. For example, the tri-state inverters 231 to 233 are provided with a PMOSFET supplying a high level voltage (logical value "1") to the data output terminal 221 and an NMOSFET supplying a low level voltage (logical value "0") to the data output terminal 221, and the driving performance of the PMOSFET is higher than that of the NMOSFET. For example, the driving performance of the PMOSFET is equal to or higher than twice that of the NMOSFET.

As the method for determining the driving abilities of the transistors 236 and 237 included in the inverter 241, a method can be used in which the gate lengths L of the transistors 236 and 237 are made the same and the gate widths W thereof are made different from each other. Generally, when the ratios W/L between the gate lengths L and the gate widths W are the same, the ratio between the driving abilities of the NMOSFET and the PMOSFET is approximately 2.2:1. Therefore, the gate width of the transistor 236 is made equal to or less than 1.1 times that of the transistor 237 so that the driving performance of the transistor 237 which is an NMOSFET is equal to or higher than twice that of the transistor 236 which is a PMOSFET. In order that the driving performance of the PMOSFETs included in the tri-state inverters 231 to 233 is equal to or higher than twice that of the NMOSFETs, the gate width of the PMOSFETs is made equal to or greater than 4.4 times that of the NMOSFETs.

With the above-described structure, in the selector 200, when in the test mode, a fault causes one of the tri-state inverters 231 to 233 to output a high level signal to the data output terminal 221 and causes one of the tri-state inverters 231 to 233 to output a low level signal to the data output terminal 221, the intermediate potential occurring at the data output terminal 221 is converted into the logical value "0", and the logical value "0" is outputted to the test output terminal 222.

Next, the operation of the selector 200 shown in FIG. 3 will be described.

In the normal operation, "1" is inputted to the mode selection terminal 214, the transistor 234 is turned off, and the transistor 235 is turned on, whereby the node 223 becomes "0" and "1" is outputted from the test output terminal 222.

In the test operation, the mode selection terminal 214 becomes active by "0" being inputted thereto, the transistor 234 is turned on, and the transistor 235 is turned off, whereby the data output terminal 221 and the node 223 are connected through the transistor 234 and the logical value corresponding to the potential of the data output terminal 221 is outputted from the test output terminal 222 (the state of the correspondence will be mentioned later).

In the selector 200 which normally includes these constituent elements, "1" (active) is inputted to only one of the data selection terminals 211 to 213, and "0" (non-active) is inputted to the other terminals. When only one terminal is active (one hot), the logic inverted signal of the data input terminal corresponding to the one-hot data selection terminal is outputted from the data output terminal 221. For example, when only the data selection terminal 211 is in one-hot state and active, the inverted signal of the corresponding data input terminal 201 is selected and outputted from the data output terminal 221.

Such a selector 200 is capable of operating at high speed when the values of the data selection terminals 211 to 213 are previously fixed, because signals are propagated from the data input terminals 201 to 203 to the data output terminal 221 through only one stage of the tri-state inverter.

Below, the operation will be described that is performed when data multiple selection state occurs because a fault corresponding to a stuck-at-1 fault occurs in any of the data selection terminals 211 to 213 due to a stuck-at-1 fault of the data selection terminals 211 to 213 themselves or a fault of an external control circuit supplying signals to the data selection terminals 211 to 213. While a case where the data selection terminal 211 is always active because of a stuck-at-1 fault occurring in itself will be described in this embodiment, the operation is similar in the cases of the data selection terminals 212 and 213.

When the data input terminal 201 is selected (case 1), "1" is inputted to the data selection terminal 211. Therefore, even when a stuck-at-1 fault occurs in the data selection terminal 211, the data input terminal 201 is selected similarly to when there is no fault. Specifically, irrespective of the values of the data input terminals 202 and 203, when the data input terminal 201 is "1", "0" is outputted to the data output terminal 221, and when the data input terminal 201 is "0", "1" is outputted thereto.

In the test mode in which the mode selection terminal 214 is "0", similarly, the operation is performed as if there were no fault. That is, when the data input terminal 201 is "1", "1" is outputted to the test output terminal 222, and when the data input terminal 201 is "0", "0" is outputted to the test output terminal 222. Therefore, the stuck-at-1 fault of the data selection terminal 211 cannot be detected from the logical value of the test output terminal 222 when the data input terminal 201 is selected.

When the data input terminal 202 is selected (case 2), the data selection terminal 212 is "1", and the data selection terminal 211 is "1" because of the fault, so that data multiple selection of the tri-state inverters 231 and 232 occurs. This will be described with respect to subdivided cases.

When the data input terminal 202 is selected, "1" is inputted to the data input terminal 201 and "1" is inputted to the data input terminal 202 (case 2.1), since the tri-state inverters 231 and 232 both output "0", "0" is outputted from the data output terminal 221. Therefore, the operation is performed as if there were no fault.

In the test mode in which the mode selection terminal 214 is "0", similarly, the operation is performed as if there were no fault. That is, similarly to when there is no fault, "1" is outputted from the test output terminal 222. Therefore, the stuck-at-1 fault of the data selection terminal 211 cannot be detected from the logical value of the test output terminal 222 when the data input terminal 202 is selected, "1" is inputted to the data input terminal 201 and "1" is inputted to the data input terminal 202.

When the data input terminal 202 is selected, "0" is inputted to the data input terminal 201 and "0" is inputted to the data input terminal 202 (case 2.2), since the tri-state inverters 231 and 232 both output "1", "1" is outputted from the data output terminal 221. Therefore, the operation is performed as if there were no fault.

In the test mode in which the mode input signal 214 is "0", similarly, the operation is performed as if there were no fault. That is, similarly to when there is no fault, "0" is outputted from the test output terminal 222. Therefore, the stuck-at-1 fault of the data selection terminal 211 cannot be detected from the logical value of the test output terminal 222 when the data input terminal 202 is selected, "0" is inputted to the data input terminal 201 and "0" is inputted to the data input terminal 202.

When the data input terminal 202 is selected, "1" is inputted to the data input terminal 201 and "0" is inputted to the data input terminal 202 (case 2.3), and since the tri-state inverter 231 outputs "0" and the tri-state inverter 232 outputs "1", an intermediate potential is outputted from the data output terminal 221. The signal at the intermediate potential depends on the switching potential of the circuit of the succeeding stage, and is propagated as the logical value "0" or "1". That is, the logical value cannot be fixed by the selector itself.

In the test mode in which the mode input signal 214 is "0", the intermediate potential of the data output terminal 221 is propagated to the input of the inverter 241 through the transistor 234. The inverter 241 outputs "0" to the test output terminal 222 because the switching potential is set to a potential lower than the lowest intermediate potential that can be achieved in a case where, when two of the tri-state inverters 231 to 233 are multi-selected, one outputs "1" and the other outputs "0", causing signal conflict and making the potential an intermediate potential. When there is no fault, since the data input terminal 202 is "0", "1" is outputted to the data output terminal 221 and "0" which is the inverted signal of the signal of the data output terminal 221 is outputted to the test output terminal 222. Therefore, the logical value outputted to the test output terminal 222 is the same as that when there is no fault. Consequently, the stuck-at-1 fault of the data selection terminal 211 cannot be detected from the logical value of the test output terminal 222 when the data input terminal 202 is selected, "0" is inputted to the data input terminal 201 and "1" is inputted to the data input terminal 202.

When the data input terminal 202 is selected, "0" is inputted to the data input terminal 201 and "1" is inputted to the data input terminal 202 (case 2.4), since the tri-state inverter 231 outputs "1" and the tri-state inverter 232 outputs "0", the intermediate potential is outputted from the data output terminal 221. The signal at the intermediate potential depends on the switching potential of the circuit of the succeeding stage, and is propagated as the logical value "0" or "1". That is, the logical value cannot be fixed by the selector itself.

In the test mode in which the mode input signal 214 is "0", the intermediate potential of the data output terminal 221 is propagated to the input of the inverter 241 through the transistor 234. The inverter 241 outputs "0" to the test output terminal 222 because the switching potential is set to a potential lower than the lowest intermediate potential that can be achieved in a case where, when two of the tri-state inverters 231 to 233 are multi-selected, one outputs "1" and the other outputs "0" to cause signal conflict and this makes the potential an intermediate potential. When there is no fault, since the data input terminal 202 is "1", "0" is outputted to the data output terminal 221 and "1" which is the inverted signal of the signal of the data output terminal 221 is outputted to the test output terminal 222. Therefore, the logical value outputted to the test output terminal 222 is different from that when there is no fault. Consequently, the stuck-at-1 fault of the data selection terminal 211 can be detected from the logical value of the test output terminal 222 when the data input terminal 202 is selected, "0" is inputted to the data input terminal 201 and "1" is inputted to the data input terminal 202.

As described above, the stuck-at-1 fault of the data selection terminal 211 can be detected from the logical value of the test output terminal 222 in the case 2.4 (when the data input terminal 202 is selected, "0" is inputted to data input terminal 201 and "1" is inputted to the data input terminal 202). For example, the occurrence of a stuck-at-1 fault in the data selection terminal 211 can be determined from the circumstance that the patterns of the cases 1, 2.1, 2.2, 2.3, and 2.4 are provided as the input signals and the output of the test output terminal 222 does not coincide with the expected value only in the case 2.4.

Although not described, a similar operation to the above-described operation performed when the data input terminal 202 is selected is performed when the data input terminal 203 is selected.

Likewise, stuck-at-1 faults of the data selection terminals 212 and 213 can also be specified.

From the above, in the selector 200 according to the present embodiment, when the intermediate potential is outputted due to a fault, the intermediate potential can be fixed to a predetermined logical value and outputted to the test output terminal 222 in the test mode. Therefore, a fault in which a plurality of tri-state devices are selected can be detected by determining whether the logical value of the test output terminal 222 coincides with the expected value or not by scanning. That is, the fault detectivity of the semiconductor integrated circuit can be improved by using the selector 200 according to the present invention.

In the selector 200 according to the present embodiment, the transistor 234 is off in the normal operation. Moreover, the transistor 234 is set, for example, so that the load capacity for the data output terminal 221 is minimized by reducing the gate width. Thereby, the increase in the load capacity for the data output terminal 221 can be reduced in the normal operation. Consequently, the reduction in the operating speed of the selector 200 can be suppressed.

Moreover, in the selector 200 according to the present embodiment, the intermediate potential outputted when the outputs of the tri-state inverters 231 to 233 conflict due to a fault is higher than VDD/2. Consequently, since it is unnecessary that the switching potential of the inverter 241 be extremely lower than VDD/2, design can be performed easily. In addition, the flexibility of design can be increased.

Moreover, in the selector 200 according to the present embodiment, a switch that switches between on and off of the data output terminal 221 and the input of the inverter 241 is formed of a PMOSFET. Thereby, even when a high potential (for example, a potential close to (VDD—the threshold value of the transistor) or equal to or higher than (VDD—the threshold value of the transistor)) is outputted to the data output terminal 221, the high-potential signal can be propagated to the input of the inverter 241.

While the number of tri-state inverters 231 to 233 is three in the description given above, it is necessary for the number of tri-state inverters only to be two or more.

Moreover, while tri-state inverters are used as the tri-state devices in the description given above, the present invention is not limited thereto. For example, tri-state buffers may be used as the tri-state devices.

Moreover, while the tri-state devices are active when the control signal is "1" in the description given above, tri-state devices that are active when the control signal is "0" may be used.

Moreover, while the transistor 234 used as the switch is a PMOSFET, it may be a semiconductor switch such as an NMOSFET or an analog switch. In this case, the logic of the mode selection terminal 214 may be set so that the switch is on in the test mode and is off in the normal operation.

Moreover, while the selector 200 is formed of a MOSFET in the description given above, it may be formed of a different transistor such as a bipolar transistor.

Moreover, while the inverted logic of the data input terminal is outputted from the data output terminal 221 in the description given above, the same logic may be outputted. Moreover, while the same logic as that of the data input terminal is outputted from the test output terminal 222 in the description given above, the inverted logic may be outputted.

Moreover, while the driving performance of the tri-state inverters 231 to 233 are set so that a value higher than VDD/2 is outputted when the intermediate potential is outputted to the data output terminal 221 due to a fault in the description given above, the driving performance of the tri-state inverters 231 to 233 may be any value as long as the inverter 241 outputs the intermediate potential outputted to the data output terminal 221 due to a fault, to the test output terminal 222 as the logical value "0". Thereby, the operating speed and the like of the selector 200 can be optimized.

Moreover, while the selector 200 having a plurality of tri-state inverters 231 to 233 is described as an example in the description given above, the present invention is applicable to a test of a plurality of tri-state devices having their outputs connected to the same node. For example, the present invention is also applicable to a circuit that tests the signal on the bus to which the outputs of a plurality of tri-state devices are connected and the tri-state devices connected to the bus.

Third Embodiment

While the selector 100 that detects a fault in which tri-state inverters are multi-selected is described in the above-described first embodiment, in a third embodiment, a selector will be described that has the function of detecting a fault in which tri-state inverters are non-selected as well as the function of detecting the fault that tri-state inverters are multi-selected.

Figure 4:
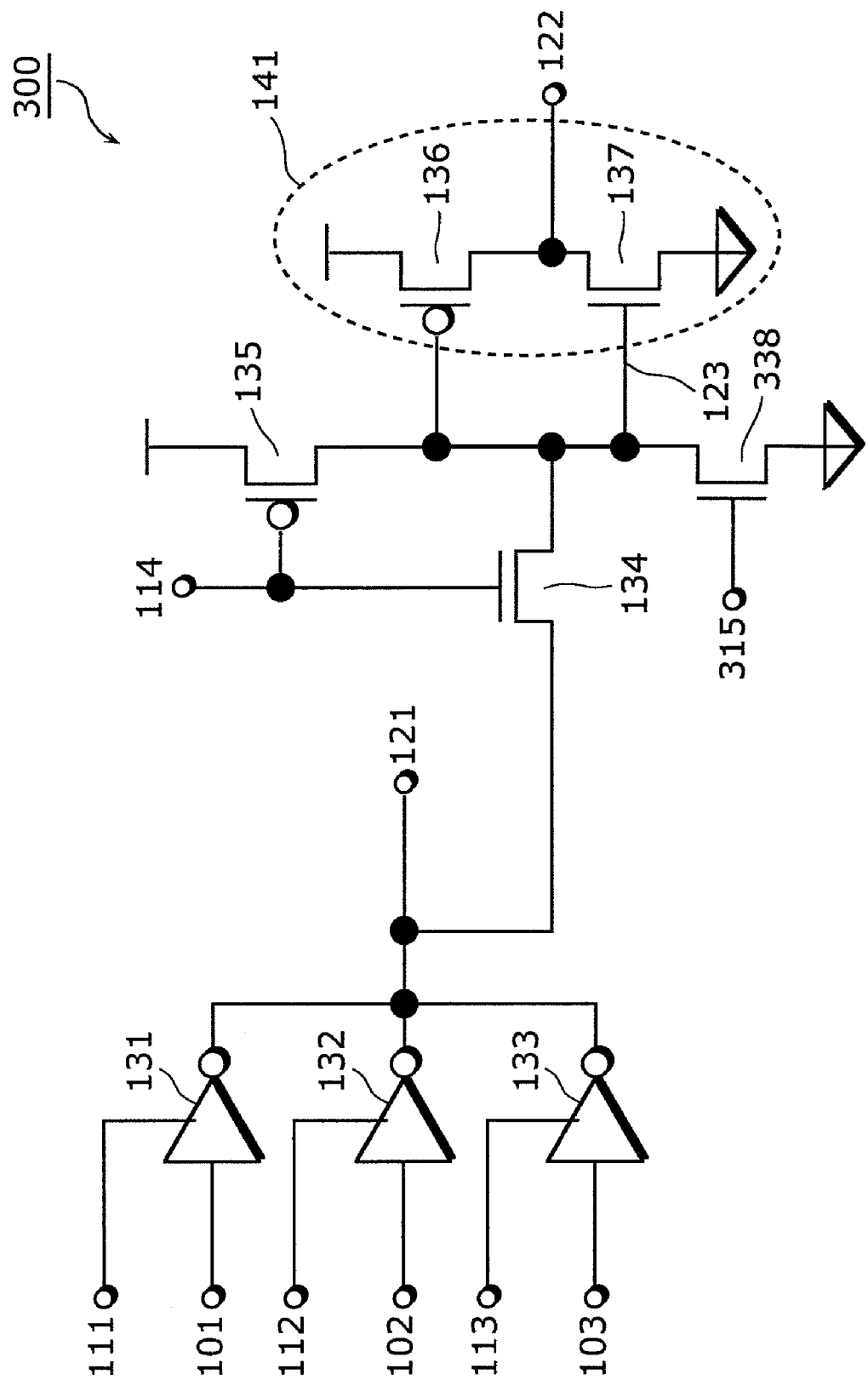
FIG. 4 is a diagram showing the structure of a selector according to a third embodiment.

FIG. 4 shows the structure of the selector according to the third embodiment of the present invention. The selector 300 shown in FIG. 4 includes a mode selection terminal 315 and a transistor 338 in addition to the constituent elements of the selector 100 shown in FIG. 2. Similar constituent elements to those of FIG. 2 are denoted by the same reference designations, and detailed descriptions thereof are omitted.

The transistor 338 is an NMOSFET, and has its gate connected to the mode selection terminal 315, its drain connected to the node 123, and its source connected to GND. The signal applied to the mode selection terminal 315 is a signal that is "1" in the test mode. The transistor 338 operates so as to pull down the node 123 when the mode selection terminal 315 is "1" and to be turned off when the mode selection terminal 315 is "0". That is, when the mode selection terminal 315 is "0", an operation exactly the same as that in the first embodiment is performed.

The driving performance of the transistor 338 is sufficiently weak compared to that of the tri-state inverters 131 to 133. Moreover, the switching potential of the inverter 141 is set to a potential higher than the highest intermediate potential that the node 123 can achieve when the transistor 134 and the transistor 338 are further turned on under a condition where, when two of the tri-state inverters 131 to 133 are multi-selected, one outputs "1" and the other outputs "0" to cause signal conflict.

The mode selection terminal 315 is set so that "1" is applied thereto only when the mode selection terminal 114 is "1". This is because if the mode selection terminal 315 is "1" when the mode selection terminal 114 is "0", the transistor 135 and the transistor 338 are on at the same time and a flow-through current continues flowing. To prevent this, for example, the AND of the mode selection terminal 114 and the mode selection terminal 315 may be inputted to the gate of the transistor 338.

The operation performed when the mode selection terminal 315 is "1" and the tri-state inverters 131 to 133 are in the one-hot state or when two of them are multi-selected is the same as that of the first embodiment. This is because the switching potential of the inverter 141 is set to a potential higher than the highest intermediate potential that the node 123 can achieve under a condition where, when two of the tri-state inverters 131 to 133 are multi-selected, one outputs "1" and the other outputs "0" and further, the transistor 338 is on.

That is, the selector 300 is capable of detecting stuck-at-1 faults of the data selection terminals 111 to 113 like the first embodiment.

Next, the operation will be described that is performed when the data output terminal 121 is in high-impedance state because a fault corresponding to a stuck-at-0 fault occurs in any of the data selection terminals 111 to 113 due to a stuck-at-0 fault of the data selection terminals 111 to 113 themselves or a fault of an external control circuit supplying signals to the data selection terminals 111 to 113.

In this case, since it is only the pulling down of the transistor 338 that drives the node 123 by setting both the mode selection terminal 114 and the mode selection terminal 315 at "1", the node 123 is "0", and "1" is outputted from the test output terminal 122. For example, by inputting a pattern in which "0" is outputted to the test output terminal 122, stuck-at-0 faults of the data selection terminals 111 to 113 can be detected.

As described above, in the selector 300 according to the present embodiment, in the test mode, the logical value "1" is outputted to the test output terminal 122 when the outputs of the tri-state inverters 131 to 133 are all high impedance. That is, the selector 300 according to the present embodiment is capable of defining the condition of the test output terminal 122 at the time of a stuck-at-0 fault of any of the data selection terminals 111 to 113. Consequently, the detection of a stuck-at-0 fault of any of the data selection terminals 111 to 113 can be improved.

Moreover, in the selector 300 according to the third embodiment, the transistor 134 is off in the normal operation. Thereby, the load capacity for the data output terminal 121 in the normal operation is approximately similar to that in the selector 100 according to the first embodiment. Consequently, the selector 300 according to the third embodiment can detect stuck-at-0 faults of the data selection terminals 111 to 113 in addition to the function of the selector 100 according to the first embodiment without the load capacity for the data output terminal 121 being increased.

While stuck-at-1 faults of the data selection terminals 111 to 113 are detected under a condition where the mode selection terminals 114 and 315 are "1" in the description given above, a structure may be adopted such that stuck-at-0 faults of the data selection terminals 111 to 113 are detected under a condition where the mode selection terminals 114 and 315 are "1" and stuck-at-1 faults of the data selection terminals 111 to 113 are detected under a condition where the mode selection terminal 114 is "1" and the mode selection terminal 315 is "0".

Fourth Embodiment

In the above-described third embodiment, a selector is described that outputs the logical value "1" when a stuck-at-0 fault of a data selection terminal occurs. In a fourth embodiment of the present invention, a selector will be described that outputs the logical value "0" when a stuck-at-0 fault of a data selection terminal occurs.

Figure 5:
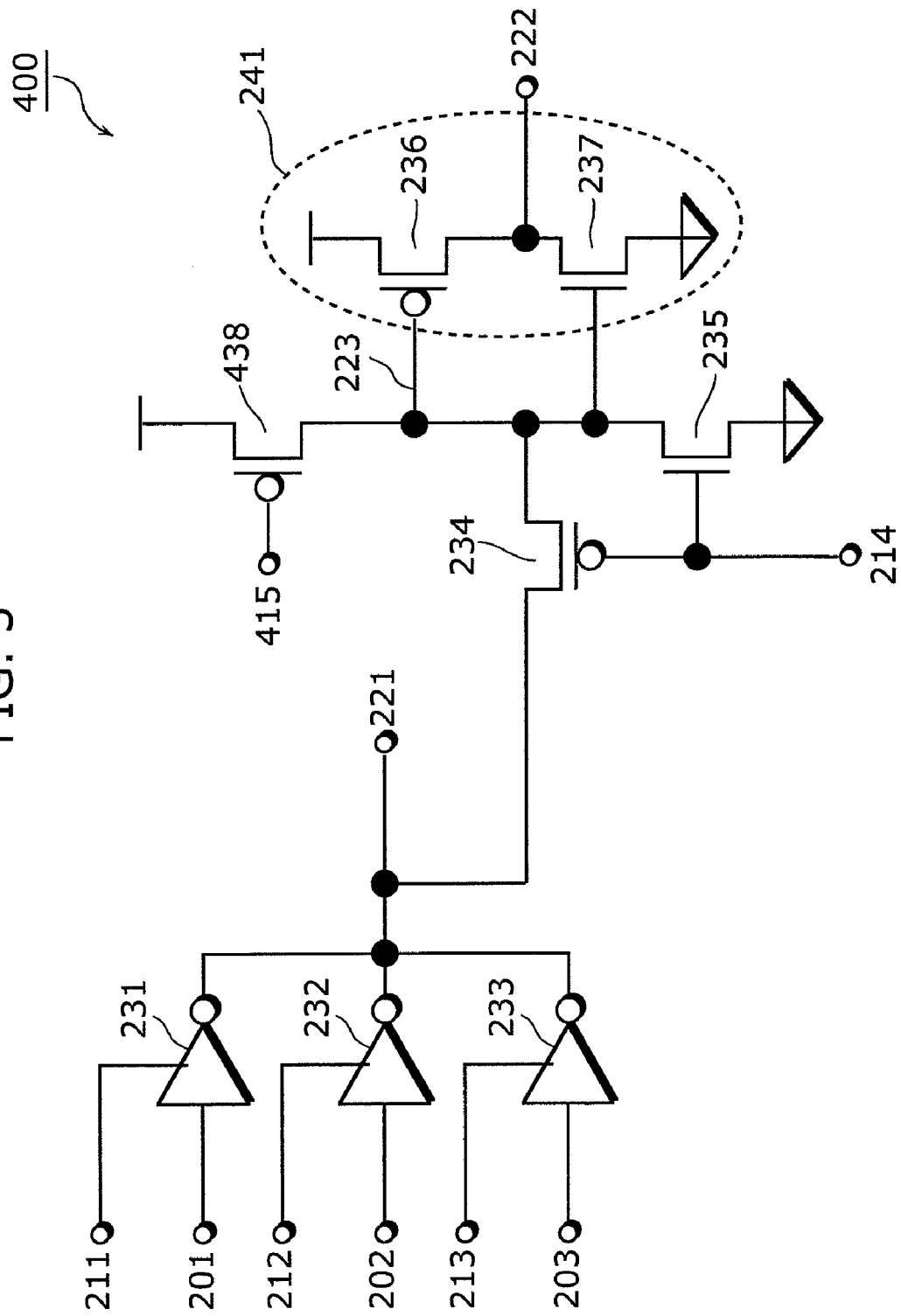
FIG. 5 is a diagram showing the structure of a selector according to a fourth embodiment.

FIG. 5 shows the structure of the selector according to the fourth embodiment of the present invention. The selector 400 shown in FIG. 5 includes a mode selection terminal 415 and a transistor 438 in addition to the constituent elements of the selector 200 shown in FIG. 3. Similar constituent elements to those of FIG. 3 are denoted by the same reference designations, and detailed descriptions thereof are omitted.

The transistor 438 is a PMOSFET, and has its gate connected to the mode selection terminal 415, its drain connected to the node 223, and its source connected to the power source. The signal applied to the mode selection terminal 415 is a signal that is "0" in the test mode. The transistor 438 operates so as to pull up the node 223 when the mode selection terminal 415 is "0" and to be turned off when the mode selection terminal 415 is "1". That is, when the mode selection terminal 415 is "1", an operation exactly the same as that in the second embodiment is performed.

The driving performance of the transistor 438 is sufficiently weak compared to that of the tri-state inverters 231 to 233. Moreover, the switching potential of the inverter 241 is set to a potential lower than the lowest intermediate potential that the node 223 can achieve when the transistor 234 and the transistor 438 are further on under a condition where, when two of the tri-state inverters 231 to 233 are multi-selected, one outputs "1" and the other outputs "0" to cause signal conflict.

The mode selection terminal 415 is set so that "0" is applied thereto only when the mode selection terminal 214 is "0". This is because if the mode selection terminal 415 is "0" when the mode selection terminal 214 is "1", the transistor 235 and the transistor 438 are on at the same time and a flow-through current continues flowing.

To prevent this, for example, the AND of the mode selection terminal 214 and the mode selection terminal 415 may be inputted to the gate of the transistor 438.

The operation performed when the mode selection terminal 415 is "1" and the tri-state inverters 231 to 233 are in one-hot state or when two of them are multi-selected is the same as that of the second embodiment. This is because the switching potential of the inverter 241 is set to a potential lower than the lowest intermediate potential that the node 223 can achieve under a condition where, when two of the tri-state inverters 231 to 233 are multi-selected, one outputs "1" and the other outputs "0" and further, the transistor 438 is on.

That is, the selector 400 is capable of detecting stuck-at-1 faults of the data selection terminals 211 to 213 like the second embodiment.

Next, the operation will be described that is performed when the data output terminal 221 is in high-impedance state because a fault corresponding to a stuck-at-0 fault occurs in any of the data selection terminals 211 to 213 due to a stuck-at-0 fault of the data selection terminals 211 to 213 themselves or a fault of an external control circuit supplying signals to the data selection terminals 211 to 213.

In this case, since it is only the pull up of the transistor 438 that drives the node 223 by setting both the mode selection terminals 214 and 415 at "0", the node 223 is "1", and "0" is outputted from the test output terminal 222. For example, by inputting a pattern in which "1" is outputted to the test output terminal 222, stuck-at-0 faults of the data selection terminals 211 to 213 can be detected.

As described above, in the selector 400 according to the present embodiment, in the test mode, the logical value "0" is outputted to the test output terminal 222 when the outputs of the tri-state inverters 231 to 233 are all high impedance. That is, the selector 400 according to the present embodiment is capable of defining the condition of the test output terminal 222 at the time of a stuck-at-0 fault of any of the data selection terminals 211 to 213. Consequently, the detection of a stuck-at-0 fault of any of the data selection terminals 211 to 213 can be improved.

Moreover, in the selector 400 according to the fourth embodiment, the transistor 234 is off in the normal operation. Thereby, the load capacity for the data output terminal 221 in the normal operation is approximately similar to that in the selector 200 according to the second embodiment. Consequently, the selector 400 according to the fourth embodiment can detect stuck-at-0 faults of the data selection terminals 211 to 213 in addition to the function of the selector 200 according to the second embodiment without the load capacity for the data output terminal 221 being increased.

While stuck-at-1 faults of the data selection terminals 211 to 213 are detected under a condition where the mode selection terminals 214 and 415 are "0" in the description given above, a structure may be adopted that stuck-at-0 faults of the data selection terminals 211 to 213 are detected under a condition where the mode selection terminals 214 and 415 are "0" and stuck-at-1 faults of the data selection terminals 211 to 213 are detected under a condition where the mode selection terminal 214 is "0" and the mode selection terminal 415 is "1".

Fifth Embodiment

A logical circuit that collectively detects faults of a selector of a plurality of bits having a plurality of selectors 100 according to the first embodiment will be described in a fifth embodiment.

Figure 6:
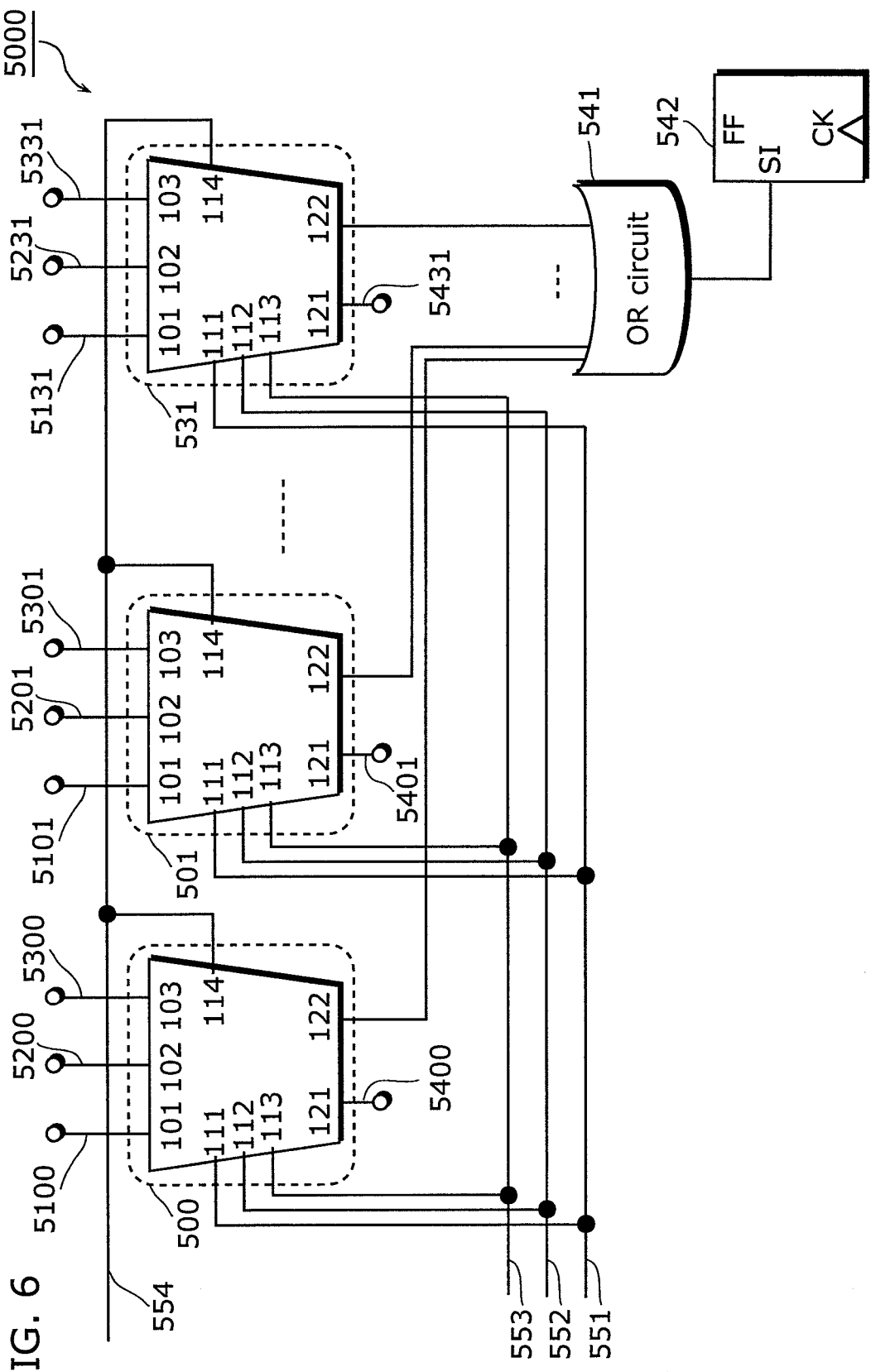
FIG. 6 is a diagram showing the structure of a logical circuit according to a fifth embodiment.

FIG. 6 shows the structure of the logical circuit according to the fifth embodiment of the present invention.

The logical circuit 5000 shown in FIG. 6 includes 32 selectors 500 to 531, an OR circuit 541, and a flip-flop 542.

The selectors 500 to 531 are each the selector 100 shown in FIG. 2. To the data selection terminal 111 of each of the selectors 500 to 531, a data selection signal 551 is supplied, to the data selection terminal 112 thereof, a data selection signal 552 is supplied, and to the data selection terminal 113 thereof, a data selection signal 553 is supplied. To the mode selection terminal 114 of each of the selectors 500 to 531, a mode input signal 554 is supplied.

The data input terminals 101 of the selectors 500 to 531 are connected to data input terminals 5100 to 5131, respectively, the data input terminals 102 thereof are connected to data input terminals 5200 to 5231, respectively, and the data input terminals 103 thereof are connected to data input terminals 5300 to 5331, respectively. The data output terminals 121 of the selectors 500 to 531 are connected to data output terminals 5400 to 5431, respectively. That is, the selectors 500 to 531 operate as a 32-bit selector that performs a common operation under a common control signal.

The OR circuit 541 is a 32-input OR circuit, and to the input thereof, the test output terminals 122 of the selectors 500 to 531 are connected. That is, the OR circuit 541 outputs the logical value "1" when at least one of the selectors 500 to 531 outputs the logical value "1" to the test output terminal 122, and outputs "0" when all the selectors 500 to 531 output the logical value "0" to the test output terminals 122.

The flip-flop 542 is a flip-flop to be scanned, and a scan data input terminal SI is connected to the output of the OR circuit 541.

While the operation of each of the selectors 500 to 531 will not be described because it is described in the first embodiment, when the mode input signal 554 is "0", the selectors 500 to 531 perform the normal operation, that is, operate as a 32-bit selector, and each output "0" from the test output terminal 122.

When the mode input signal 554 is "1", the selectors 500 to 531 perform the test operation, that is, are in a mode in which the data multiple selection state of the 32-bit selector can be tested.

As described in the first embodiment, in the test mode, the selectors 500 to 531 output the logical value "1" to the test output terminals 122 when a stuck-at-1 fault occurs in any of the data selection terminals 111 to 11 and an intermediate potential is outputted. Therefore stuck-at-1 faults of the selectors 500 to 531 can be detected by inputting a pattern in which the logical value "0" is outputted to the test output terminals 122, when there is no fault. The test output terminals 122 of the selectors 500 to 531 are connected to the input of the OR circuit 541. Therefore, when a stuck-at-1 fault occurs in the data selection terminal 111 of at least one of the selectors 500 to 531 or when a stuck-at-1 fault occurs in the data selection signal 551, the OR circuit 541 outputs "0". When all the selectors 500 to 531 operate normally and output "0" to the test output terminals 122, the OR circuit 541 outputs "1". The output signal of the OR circuit 541 is captured by the flip-flop 542 through the data input terminal SI of the flip-flop 542.

From the above, the logical circuit 5000 according to the fifth embodiment is capable of determining whether a stuck-at-1 fault occurs in at least one of the 32 selectors 500 to 531 or not from the data held by the flip-flop 542.

Moreover, the logical circuit 5000 according to the fifth embodiment is realized whether a stuck-at-1 fault occurs in 32 selectors or not by allocating only the OR circuit 541 and the flip-flop 542. That is, the number of flip-flops to be scanned can be significantly reduced compared to when a flip-flop to be scanned is allocating for the test output terminal 122 of each of the selectors 500 to 531 (when 32 flip-flops are allocated). This produces advantages such as the reduction in the number of scan shifts, the reduction in area, and the reduction in clock load.

In which of the data selection terminals 111 of the selectors 500 to 531 a stuck-at-1 fault occurs and whether a stuck-at-1 fault already occurs in the data selection signal 551 itself or not can be determined by checking the output condition of the OR circuit 541 by changing the condition of the input signal to each selector. Consequently, in which of the data selection terminals 111 of the selectors 500 to 531 a stuck-at-1 fault occurs and whether a stuck-at-1 fault already occurs in the data selection signal 551 itself or not can be easily determined by confirming the value of the flip-flop 542 to be scanned.

While a case where a stuck-at-1 fault occurs in the data selection terminal 111 is described in the description given above, a stuck-at-1 fault of the data selection terminal 112 or 113 of any of the selectors 500 to 531 can be detected similarly. Moreover, it can be easily determined that a stuck-at-1 fault occurs in the data selection signal 552 or 553.

While the logical circuit 5000 uses the OR circuit 541 in the description given above, the present invention is not limited to this structure. For example, a NOR circuit or the like may be used. Moreover, a structure may be adopted that the selectors 200 according to the second embodiment are used as the selectors 500 to 531 and an AND circuit, a NAND circuit, or the like is used.

Sixth Embodiment

A logical circuit that collectively detects faults of a selector for a plurality of bits having a plurality of selectors 300 according to the third embodiment will be described in a sixth embodiment.

Figure 7:
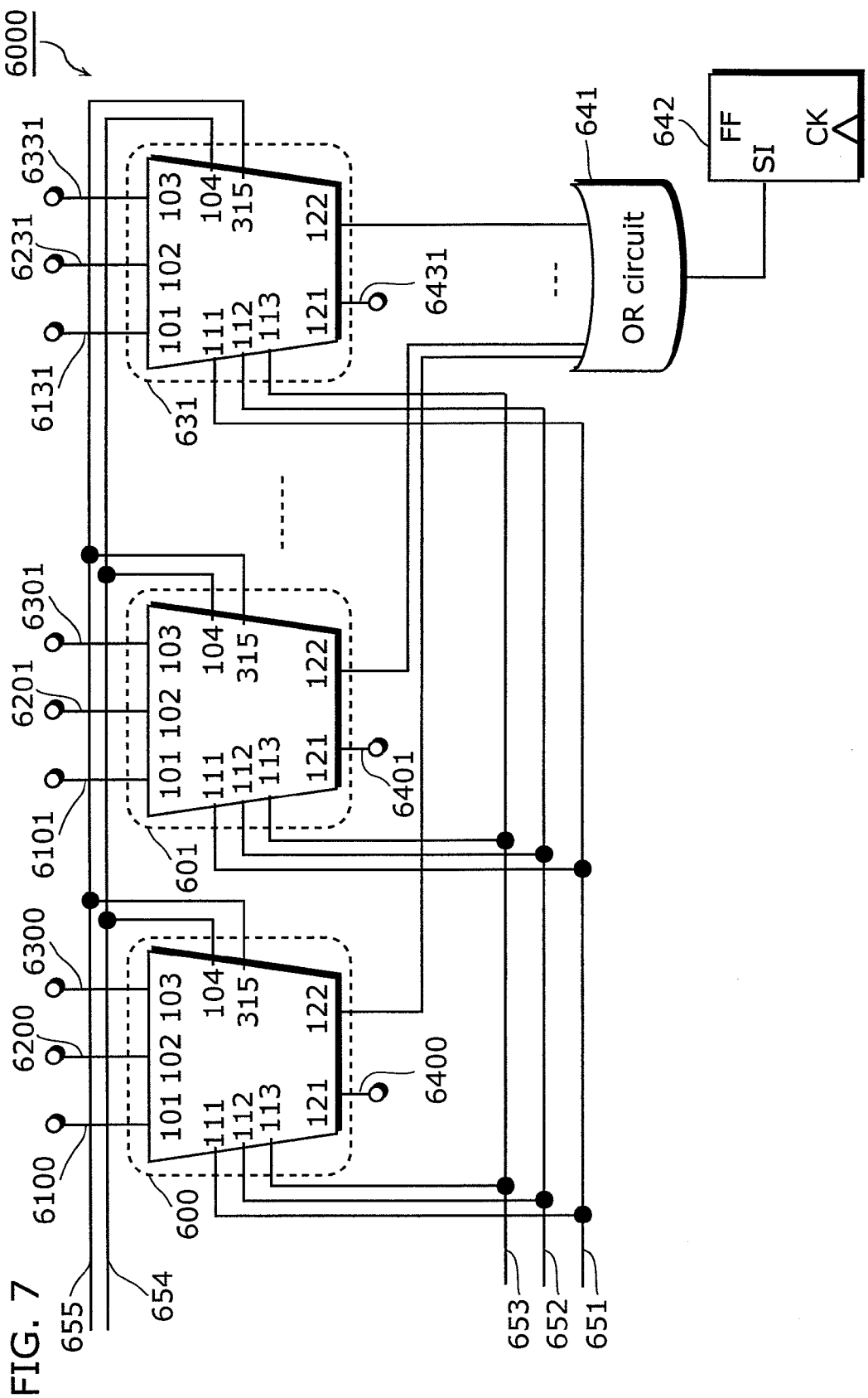
FIG. 7 is a diagram showing the structure of a logical circuit according to a sixth embodiment.

FIG. 7 shows the structure of the logical circuit according to the sixth embodiment of the present invention.

The logical circuit 6000 shown in FIG. 7 includes 32 selectors 600 to 631, an OR circuit 641, and a flip-flop 642.

The selectors 600 to 631 are each the selector 300 shown in FIG. 4. To the data selection terminal 111 of each of the selectors 600 to 631, a data selection signal 651 is supplied, to the data selection terminal 112 thereof, a data selection signal 652 is supplied, and to the data selection terminal 113 thereof, a data selection signal 653 is supplied. To the mode selection terminal 114 of each of the selectors 600 to 631, a mode input signal 654 is supplied, and to the mode selection terminal 315, a mode input signal 655 is supplied.

The data input terminals 101 of the selectors 600 to 631 are connected to data input terminals 6100 to 6131, respectively, the data input terminals 102 thereof are connected to data input terminals 6200 to 6231, respectively, and the data input terminals 103 thereof are connected to data input terminals 6300 to 6331, respectively. The data output terminals 121 of the selectors 600 to 631 are connected to data output terminals 6400 to 6431, respectively. That is, the selectors 600 to 631 operate as a 32-bit selector that performs a common operation under a common control signal.

The OR circuit 641 is a 32-input OR circuit, and to the input thereof, the test output terminals 122 of the selectors 600 to 631 are connected. That is, the OR circuit 641 outputs the logical value "1" when at least one of the selectors 600 to 631 outputs the logical value "1" to the test output terminal 122, and outputs "0" when all the selectors 600 to 631 output the logical value "0" to the test output terminal 122.

The flip-flop 642 is a flip-flop to be scanned, and the scan data input terminal SI is connected to the output of the OR circuit 641.

The test output terminals 122 of the selectors 600 to 631 are connected to the input of the 32-input OR circuit 641. The output of the OR circuit 641 is connected to the scan data input terminal of the flip-flop 642 to be scanned.

While the operation of each of the selectors 600 to 631 will not be described because it is described in the third embodiment, when the mode input signal 654 is "0" and the mode input signal 655 is "0", the selectors 600 to 631 perform the normal operation, that is, operate as a 32-bit selector, and each output "0" from the test output terminal 122.

When the mode input signal 654 is "1" and the mode input signal 655 is "0", the selectors 600 to 631 perform a test operation, that is, are in a mode in which the data multiple selection state of the 32-bit selector can be tested as in the fifth embodiment.

As described in the fifth embodiment, in the test mode, the selectors 600 to 631 output the logical value "1" to the test output terminals 122 when a stuck-at-1 fault occurs in any of the data selection terminals 111 to 113 and an intermediate potential is outputted. Therefore, stuck-at-1 faults of the selectors 600 to 631 can be detected by inputting a pattern in which the logical value "0" is outputted to the test output terminals 122, when there is no fault. The test output terminals 122 of the selectors 600 to 631 are connected to the input of the OR circuit 641. Therefore, when a stuck-at-1 fault occurs in the data selection terminal 111 of at least one of the selectors 600 to 631 or when a stuck-at-1 fault occurs in the data selection signal 651, the OR circuit 641 outputs "0". When all the selectors 600 to 631 operate normally and output "0" to the test output terminals 122, the OR circuit 641 outputs "1". The output signal of the OR circuit 641 is captured by the flip-flop 642 through the scan data input terminal SI of the flip-flop 642.

Moreover, as described in the third embodiment, when the mode input signal 654 is "1" and the mode input signal 655 is "0", the selectors 600 to 631 perform a data non-selection test operation, that is, are in a mode in which the data non-selection state of the 32-bit selector can be tested.

In the data non-selection test operation mode, the selectors 600 to 631 output the logical value "1" to the test output terminals 122 when a stuck-at-0 fault occurs in the data selection terminal 111 and the data output terminal 121 is in a high-impedance state. Therefore, stuck-at-0 faults of the selectors 600 to 631 can be detected by inputting a pattern in which the logical value "0" is outputted to the test output terminals 122, when there is no fault. The test output terminals 122 of the selectors 600 to 631 are connected to the input of the OR circuit 641. Therefore, when a stuck-at-0 fault occurs in the data selection terminal 111 of at least one of the selectors 600 to 631 or when a stuck-at-0 fault occurs in the data selection signal 651, the OR circuit 641 outputs "0". When all the selectors 600 to 631 operate normally and output "0" to the test output terminals 122, the OR circuit 641 outputs "1". The output signal of the OR circuit 641 is captured by the flip-flop 642 through the scan data input terminal SI of the flip-flop 642.

From the above, the logical circuit 6000 according to the sixth embodiment is capable of determining whether a stuck-at-1 fault occurs in at least one of the 32 selectors 600 to 631 or not from the data held by the flip-flop 642. Further, the logical circuit 6000 according to the sixth embodiment is capable of determining whether a stuck-at-0 fault occurs in at least one of the 32 selectors 600 to 631 or not from the data held by the flip-flop 642.

Moreover, the logical circuit 6000 according to the sixth embodiment is realized whether or not a stuck-at-1 fault or a stuck-at-0 fault occurs in any of 32 selectors by allocating only the OR circuit 641 and the flip-flop 642. That is, the number of flip-flops to be scanned can be significantly reduced compared to when a flip-flop to be scanned is allocated to the test output terminal 122 of each of the selectors 600 to 631 (when 32 flip-flops are allocated). This produces advantages such as a reduction in the number of scan shifts, a reduction in area, and a reduction in clock load.

In which of the data selection terminals 111 of the selectors 600 to 631 a stuck-at-1 fault occurs and whether a stuck-at-1 fault already occurs in the data selection signal 651 itself or not can be determined by checking the output condition of the OR circuit 641 by changing the condition of the input signal to each selector. Consequently, in which of the data selection terminals 111 of the selectors 600 to 631 a stuck-at-1 fault occurs and whether a stuck-at-1 fault already occurs in the data selection signal 651 itself or not can be easily determined by confirming the value of the flip-flop 642 to be scanned. Likewise, in which of the data selection terminals 111 of the selectors 600 to 631 a stuck-at-0 fault occurs and whether a stuck-at-0 fault already occurs in the data selection signal 651 itself or not can be determined by checking the output condition of the OR circuit 641 by changing the condition of the input signal to each selector. Consequently, in which of the data selection terminals 111 of the selectors 600 to 631 a stuck-at-0 fault occurs and whether a stuck-at-0 fault already occurs in the data selection signal 651 itself or not can be easily determined by confirming the value of the flip-flop 642 to be scanned.

While a case where a stuck-at-1 fault or a stuck-at-0 fault occurs in the data selection terminal 111 is described in the description given above, a stuck-at-1 fault or a stuck-at-0 fault of the data selection terminal 112 or 113 of any of the selectors 600 to 631 can be detected similarly. Moreover, it can be easily determined that a stuck-at-1 fault or a stuck-at-0 fault occurs in the data selection signal 652 or 653.

While the logical circuit 6000 uses the OR circuit 641 in the description given above, the present invention is not limited to this structure. For example, a NOR circuit or the like may be used. Moreover, a structure may be adopted such that the selectors 400 according to the fourth embodiment are used as the selectors 600 to 631 and an AND circuit, a NAND circuit, or the like is used.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is applicable to a test circuit, a selector, and a semiconductor integrated circuit, and more particularly, applicable to a selector and a test circuit used for a semiconductor integrated circuit that are required to be dense and fast.

What is claimed is:

1. A selector having a test mode to detect a fault, said selector comprising:
   a data output terminal;
   a test output terminal;
   a first tri-state device having an output connected to said data output terminal;
   a second tri-state device having an output connected to said data output terminal; and
   a tester operable to output a first logical value or a second logical value to said test output terminal according to whether a voltage of said data output terminal is higher or lower than a threshold value in the test mode, said tester being operable to convert an intermediate potential occurring in said data output terminal into the first logical value and to output the first logical value to said test output terminal when said first tri-state device outputs a high level signal to said data output terminal and said second tri-state device outputs a low level signal to said data output terminal in the test mode,
   wherein said tester includes:
   a semiconductor switch that has one end connected to said data output terminal, is on in the test mode, and is off when not in the test mode; and
   an inverter having an input connected to an other end of said semiconductor switch and an output connected to said test output terminal.

2. The selector according to claim 1,
   wherein the first logical value is a logical value "1", and said inverter includes:
   a first p-type transistor having a gate connected to the other end of said semiconductor switch, a drain connected to said test output terminal, and a source connected to a power source; and
   a first n-type transistor having a gate connected to the other end of said semiconductor switch, a drain connected to said test output terminal, and a source connected to a ground,
   a driving performance of said first p-type transistor being higher than a driving performance of said first n-type transistor.

3. The selector according to claim 2,
   wherein said tester further includes a second n-type transistor having a gate to which a signal is inputted in the test mode, a drain connected to the other end of said semiconductor switch, and a source connected to a ground, the signal having a value which is the logical value "1".

4. The selector according to claim 1,
   wherein the first logical value is a logical value "0", and said inverter includes:
   a first p-type transistor having a gate connected to the other end of said semiconductor switch, a drain connected to said test output terminal, and a source connected to a power source; and
   a first n-type transistor having a gate connected to the other end of said semiconductor switch, a drain connected to said test output terminal, and a source connected to a ground,
   a driving performance of said first n-type transistor being higher than a driving performance of said first p-type transistor.

5. The selector according to claim 4,
   wherein said tester further includes a second p-type transistor having a gate to which a signal is inputted in the test mode, a drain connected to the other end of said semiconductor switch, and a source connected to a power source, the signal having a value which is the logical value "0".

6. The selector according to claim 1,
   wherein the first logical value is a logical value "1", and said inverter includes:
   a first p-type transistor having a gate connected to the other end of said semiconductor switch, a drain connected to said test output terminal, and a source connected to a power source; and
   a first n-type transistor having a gate connected to the other end of said semiconductor switch, a drain connected to said test output terminal, and a source connected to a ground,
   a gate width of said first p-type transistor being equal to or greater than 4.4 times a gate width of said first n-type transistor.

7. The selector according to claim 1,
   wherein the first logical value is a logical value "0", and said inverter includes:
   a first p-type transistor having a gate connected to the other end of said semiconductor switch, a drain connected to said test output terminal, and a source connected to a power source; and
   a first n-type transistor having a gate connected to the other end of said semiconductor switch, a drain connected to said test output terminal, and a source connected to a ground,
   a gate width of said first p-type transistor being equal to or less than 1.1 times a gate width of said first n-type transistor.

8. A semiconductor integrated circuits comprising:
   a plurality of selectors having a test mode to detect a fault, each of said plurality of selectors including:
   a data output terminal;
   a test output terminal;
   a first tri-state device having an output connected to said data output terminal;
   a second tri-state device having an output connected to said data output terminal; and
   a tester operable to output a first logical value or a second logical value to said test output terminal according to whether a voltage of said data output terminal is higher or lower than a threshold value in the test mode, and
   said tester converts an intermediate potential occurring in said data output terminal into the first logical value and outputs the first logical value to said test output terminal when said first tri-state device outputs a high level signal to said data output terminal and said second tri-state device outputs a low level signal to said data output terminal in the test mode, and the semiconductor integrated circuit further including a logical circuit that outputs a third logical value when at least one of said selectors outputs the first logical value to said test output terminal, and outputs a fourth logical value different from the third logical value when all of said selectors output the second logical value to said test output terminal.

9. The semiconductor integrated circuit according to claim 8, further comprising:
a flip-flop to be scanned having a data input terminal connected to an output of said logical circuit.

* * * * *